United States Patent
Yu et al.

(10) Patent No.: US 11,239,429 B1
(45) Date of Patent: Feb. 1, 2022

(54) SUPERLUMINESCENT HALIDE PEROVSKITE LIGHT-EMITTING DIODES WITH A SUB-BANDGAP TURN-ON VOLTAGE

(71) Applicant: The Florida State University Research Foundation, Inc., Tallahassee, FL (US)

(72) Inventors: Zhibin Yu, Tallahassee, FL (US); Junqiang Li, Tallahassee, FL (US); Xin Shan, Tallahassee, FL (US)

(73) Assignee: THE FLORIDA STATE UNIVERSITY RESEARCH FOUNDATION, INC., Tallahassee, FL (US)

( * ) Notice: Subject to any disclaimer, the term of this patent is extended or adjusted under 35 U.S.C. 154(b) by 811 days.

(21) Appl. No.: 15/626,759

(22) Filed: Jun. 19, 2017

Related U.S. Application Data (63) Continuation-in-part of application No. PCT/US2016/036386, filed on Jun. 8, 2016.

(60) Provisional application No. 62/351,323, filed on Jun. 17, 2016, provisional application No. 62/172,499, filed on Jun. 8, 2015.

(51) Int. Cl.
*H01L 51/00* (2006.01)
*H01L 51/50* (2006.01)
*H01L 51/56* (2006.01)

(52) U.S. Cl.
CPC ........ *H01L 51/0077* (2013.01); *H01L 51/004* (2013.01); *H01L 51/0026* (2013.01); *H01L 51/5032* (2013.01); *H01L 51/56* (2013.01)

(58) Field of Classification Search
None
See application file for complete search history.

(56) References Cited

U.S. PATENT DOCUMENTS

2016/0268510 A1* 9/2016 Moon .................. H01L 51/424
2017/0358759 A1* 12/2017 Lee ..................... H01L 51/0037

FOREIGN PATENT DOCUMENTS

WO WO-2016/072809 A1 * 5/2016

OTHER PUBLICATIONS

Gil-Escrig et al. (Chem. Commun. 2015, 51, p. 569).*
Hessen et al., New Reduced Ternary Titanates from Borate Fluxes. Journal of Solid State Chemistry. 1991. vol. 94: 306-312.
Hessen et al., Crystallization of Reduced Strontium and Barium Niobate Perovskites from Borate Fluxes. Mat. Res. Bull. 1991. vol. 26: 85-90.

(Continued)

*Primary Examiner* — Jay Yang
(74) *Attorney, Agent, or Firm* — Eversheds Sutherland (US) LLP (57) ABSTRACT

An emissive perovskite ternary composite thin film comprising a perovskite material, an ionic-conducting polymer and an ionic-insulating polymer is provided. Additionally, a single-layer LEDs is described using a composite thin film of organometal halide perovskite (Pero), an ionic-conducting polymer (ICP) and an ionic-insulating polymer (IIP). The LEDs with Pero-ICP-IIP composite thin films exhibit a low turn-on voltage of about 1.9V (defined at 1 cd m$^{-2}$ luminance) and a luminance of about 600,000 cd m$^{-2}$.

8 Claims, 10 Drawing Sheets
(6 of 10 Drawing Sheet(s) Filed in Color)

(56) References Cited

OTHER PUBLICATIONS

Siegrist el al., The Crystal-Structure of Superconducting LuNi2B2C and the Related Phase LuNiBC. Nature. 1994. vol. 367: 254-256.
Prieto et al., New barium manganese titanates prepared under reducing conditions. Solid State Sciences. 2002. vol. 4: 323-327.
Siegrist et al., Combining magnets and dielectrics: Crystal chemistry in the BaO—Fe2O3—TiO2 system. Eur. J. Inorg Chem. 2003:1483-1501.
Chen et al., Single-layer triplet white polymer light-emitting diodes incorporating polymer oxides: Effect of charge trapping at phosphorescent dopants. Applied Physics Letters. 2009. vol. 94: 043306.
Tan el al., Brigh light-emitting diodes based on organometal halide perovskite. Nature Nanotechnology. 2014. vol. 9: 687-692.
Armstrong et al., Light-Emitting Electrochemical Processes. Annu. Rev. Phys. Chem. 2001. vol. 52: 391-422.
International Search Report and Written Opinion for PCT/US16/36386 (filing date: Jun. 8, 2016) dated Sep. 6, 2016; Applicant: The Florida State University Research Foundation, Inc.

\* cited by examiner

SUPERLUMINESCENT HALIDE PEROVSKITE LIGHT-EMITTING DIODES WITH A SUB-BANDGAP TURN-ON VOLTAGE

CROSS-REFERENCE TO RELATED APPLICATIONS

This application is a continuation-in-part of and claims priority to International Application Serial No. PCT/US16/36386 filed on Jun. 8, 2016, which claims priority to provisional U.S. Application Ser. No. 62/172,499 filed on Jun. 8, 2015. The present invention also claims priority to U.S. Provisional Patent Application Ser. No. 62/351,323 filed on Jun. 17, 2016. The related applications mentioned above are hereby incorporated by reference in their entirety.

FEDERALLY SPONSORED RESEARCH OR DEVELOPMENT

This invention was made with Government support under Grant No. FA9550-16-1-0124 awarded by the U.S. Air Force Office of Scientific Research, and Grant No. ECCS1609032 awarded by the National Science Foundation. The government has certain rights in the invention.

BACKGROUND OF THE INVENTION

1. Field of the Invention

This invention relates, generally, to light-emitting diodes (LEDs). More specifically, it relates to single-layer LEDs utilizing a composite thin film of organometal halide perovskite polymer.

2. Brief Description of the Prior Art

Organometal halide perovskites ('peros') are materials with an ABX3 crystal structure resembling that commonly found in barium titanate (BaTiO3). More specifically, in peros, A is a cesium (Cs+) or an aliphatic ammonium (RNH3+) cation, B is a divalent cation of lead (Pb2+) or tin (Sn2+), and X is an anion such as chloride (Cl−), bromide (Br−), or iodide (I−). Peros have recently been discovered to have remarkable optoelectronic properties, eliciting research into their potential as photovoltaic and light-emitting devices In recent years, LEDs have evolved as important commercial products to replace traditional incandescent and fluorescent light bulbs for display and lighting applications.

The need for larger device size and lower fabrication cost has motivated the exploration of novel LED technologies including organic LEDs (OLEDs) based on organic small molecular and polymeric semiconductors, quantum-dot LEDs, and more recently Pero-LEDs. Pero-LEDs may be made from a group of $ABX_3$ halide perovskite semiconductors. For example, A may be a cesium ($Cs^+$) or an aliphatic ammonium ($RNH^{3+}$) cation, B may be a divalent $Pb^{2+}$ cation and X may be a halide anion such as $C^-$, $Br^-$ or $I^-$. Halide perovskites have shown the advantages of low-temperature and cost-effective processing, and have also manifested exceptional electronic and optical properties that are desired for efficient electroluminescent devices.

Exemplary Pero-LEDs may be based on methylammonium lead halides ($CH_3NH_3PbX_3$, hereafter denoted as MA-Pero) or cesium lead halides ($CsPbX_3$, hereafter as Cs-Pero). Until now, the best MA-Pero LEDs that emit green light (peak wavelength at 520-540 nm) had a maximum luminance of about 20,000 cd $m^{-2}$, and the best Cs-Pero based green LEDs had a maximum luminance of 3,853 cd $m^{-2}$, both of which are much lower than the state of the art in OLEDs, quantum-dot LEDs, and gallium nitride based LEDs.

The relatively low luminance in Pero-LEDs can be attributed to inefficient electron and hole injection from the cathode and anode respectively into the halide perovskite emitters. The majority of reported Pero-LEDs use a multi-layer device structure to enhance both electron and hole injection, and their turn-on voltages (defined at 1 cd $m^{-2}$ luminance) were found to be much higher than the bandgap ($E_g$)/e of the perovskite emitters. For instance, a turn-on voltage of more than 3.0 V was commonly reported among green Pero-LEDs that emitted photons with an energy of about 2.3 eV. The only exception was observed by Wang et al. in their green Pero-LEDs which had a turn on voltage of 2.1 V and a device structure of poly(9,9-dioctyl-fluorene-co-N-(4-butylphenyl) diphenylamine)/molybdenum oxide as the hole injection layers (HILs) and polyethyleneimine-modified zinc oxide as the electron injection layres (EILs). Nonetheless, the perovskite emissive layer in such a device had discontinuous coverage, and current leakage prevented it from reaching a high luminance intensity.

Accordingly, what is needed is a method for forming single-layer Pero LEDs having an improved luminance intensity. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate the disclosure, Applicants in no way disclaim these technical aspects, and it is contemplated that the disclosure may encompass one or more of the conventional technical aspects discussed herein.

The present disclosure may address one or more of the problems and deficiencies of the prior art discussed above. However, it is contemplated that the disclosure may prove useful in addressing other problems and deficiencies in a number of technical areas. Therefore, the disclosure should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for an improved perovskite ternary composite thin film, and a single-layer Pero optoelectronic device which utilizes the improved thin film, to provide improved luminance intensity is now met by a new, useful, and nonobvious invention.

In one embodiment, the present invention provides, an emissive perovskite ternary composite thin film includes a perovskite material, an ionic-conducting polymer and an ionic-insulating polymer.

In various embodiments, the perovskite material may be an organometal halide perovskite material and more specifically, the perovskite material may be a methylammonium lead halide ($CH_3NH_3PbX_3$).

In a particular embodiment, the perovskite material is selected from cesium lead halide ($CsPbX_3$) and cesium lead tribromide ($CsPbBr_3$).

The ionic-conducting polymer may be PEO (poly(ethylene oxide)) and the ionic-insulating polymer may be a PVP (poly(vinylpyrolidone)).

In a specific embodiment, the perovskite material is cesium lead tribromide ($CsPbBr_3$), the ionic conducting polymer is PEO (poly(ethylene oxide)) and the ionic-insulating polymer is PVP (poly(vinylpyrolidone)).

In an additional embodiment, a single-layer thin film optoelectronic device is provided which includes, an anode, an emissive perovskite ternary composite thin film comprising, a perovskite material, an ionic-conducting polymer and an ionic-insulating polymer and a cathode.

A method for manufacturing a single-layer optoelectronic device is additionally provided, which includes, forming a perovskite material, adding an ionic-conducting polymer to the perovskite material to form a perovskite and ionic-conducting polymer mixture, adding an ionic-insulating polymer to the perovskite and ionic-conducting polymer mixture to form a perovskite ionic-conducting polymer and ionic-insulating polymer mixture, coating a substrate with the perovskite ionic-conducting polymer and ionic-insulating polymer mixture to form a thin-film layer on the substrate and annealing the thin-film layer.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

Charge-carrier injection into an emissive semiconductor thin film can result in electroluminescence and is generally achieved by using a multilayer device structure, which requires an electron-injection layer (EIL) between the cathode and the emissive layer, and a hole-injection layer (HIL) between the anode and the emissive layer. The recent advancement of halide perovskite semiconductors opens up a new path to electroluminescent devices with a greatly simplified device structure. Various LEDs known in the art may comprise efficient charge-carrier injection into the halide perovskite thin film without the aid of an EIL or HIL. These so-called single-layer light-emitting diodes (LEDs) have been shown to exhibit a sub-bandgap turn-on voltage. The known devices obtained a brightness of 591,197 cd m−2 at 4.8 V, with an external quantum efficiency (EQE) of 5.7% and a power efficiency of 14.1 lm W−1. It was further discovered that intervalley carrier transfer in the halide perovskite can be triggered after a threshold electrical field (~25-31.2 MV m−1), which drastically reduced its radiative emission characteristics, therefore limiting further brightness increase in halide perovskite LEDs (Pero-LEDs).

In the present invention, various embodiments comprise superluminescent Pero-LEDs with an exemplary composite emissive layer comprising cesium lead tribromide (CsPbBr$_3$), poly(ethylene oxide) (PEO) and poly(vinylpyrolidinone) (PVP). The LEDs were constructed with an indium tin oxide (ITO) anode, CsPbBr$_3$-PEO-PVP composite emissive layer, and indium-gallium eutectic (In—Ga) cathode without intentionally employing an EIL or HIL. Such single-layer devices start emitting green light at 1.9 V and reach a maximum luminance of 593,178 cd m−2 at 4.9 V. The sub-bandgap turn-on voltage suggests very efficient charge-carrier injection, and it is hypothesize that a p-i-n junction may be formed in-situ in the perovskite emissive layer when an external bias is applied. The efficient electron and hole injection eventually leads to an ultra-high brightness which is about 30 times that of the previous record in MA-Pero LEDs and 150 times that of Cs-Pero LEDs. Such an advancement also makes Pero-LEDs of the present disclosure five times brighter than the vacuum evaporated OLEDs and three times as bright as solution processed quantum-dot LEDs.

Figure 1A:
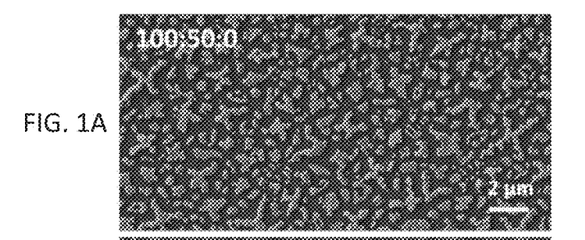
FIG. 1A is a top view SEM image of a thin film with $CsPbBr_3$:PEO=100:50.
Figure 1B:
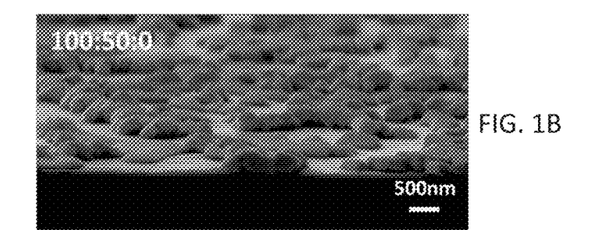
FIG. 1B is a tilted view SEM image of the thin film of FIG. 1A.
Figure 2:
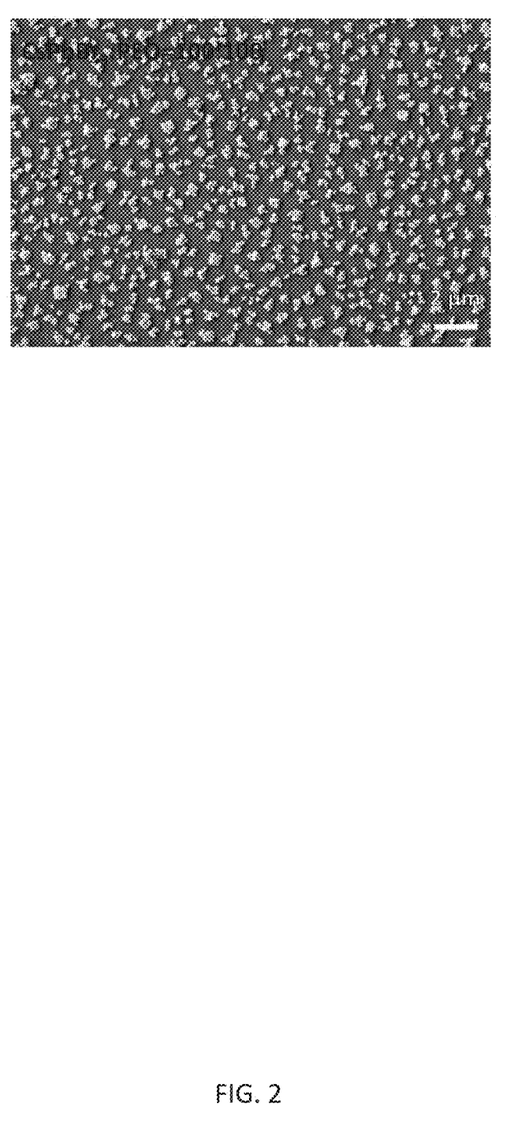
FIG. 2 is a top-view SEM image of a thin film with $CsPbBr_3$:PEO=100:100.

The emissive perovskite composite thin films in single-layer Pero-LEDs according to various embodiments were obtained by spin coating a mixture solution containing the CsPbBr$_3$ precursors, poly(ethylene oxide) (PEO) and poly (vinylpyrolidone) (PVP) with a desired weight ratio. It has been shown direct spin-coating of the MA-Pero or Cs-Pero precursor solution onto an ITO surface usually leads to a discontinuous film. The film morphology of MA-Pero was improved by blending it with an ionic conducting polymer (for example, but not limited to, PEO). Such a composite film has been successfully applied as the emissive layer in Pero-LEDs. However, mixing the CsPbBr$_3$ with PEO did not produce a continuous film as shown in the scanning electron microscope (SEM) image in FIG. 1A. The film with CsPbBr$_3$:PEO=100:50 ratio (by weight and hereafter) consisted of isolated crystals of about 0.5-2 μm in size. The overall surface coverage of the film was about 60%, leaving the remaining area nearly uncovered as seen from the cross-sectional SEM image in FIG. 1B. Increasing the PEO content in the composite did not improve film continuity, and caused the CsPbBr$_3$ crystals to become further separated, reducing their total surface coverage to about 50% as shown in FIG. 2.

Figure 1C:
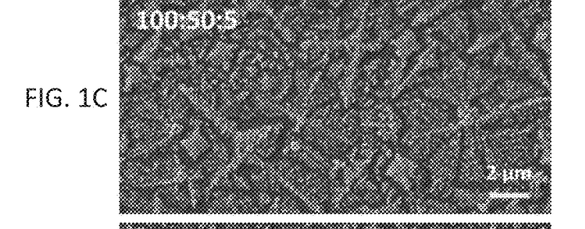
FIG. 1C is a top-view SEM image of a thin film with $CsPbBr_3$:PEO:PVP=100:50:5.
Figure 1D:
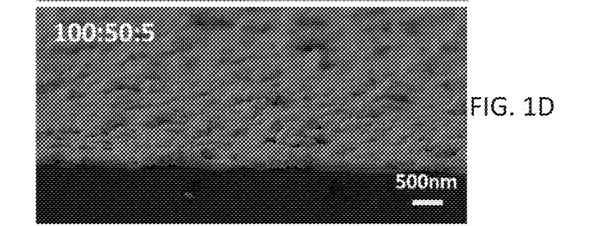
FIG. 1D is a tilted view SEM image of the thin film of FIG. 1C.
Figure 1E:
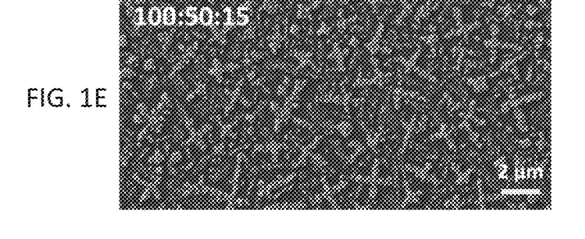
FIG. 1E is a top-view SEM image of a thin film with $CsPbBr_3$:PEO:PVP=100:50:15.
Figure 1F:
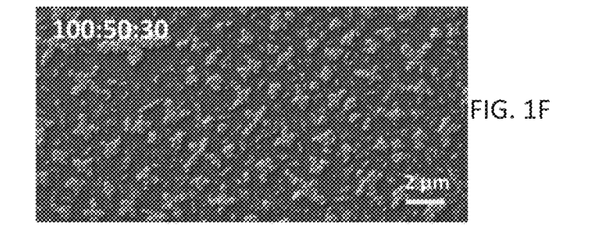
FIG. 1F is a top-view SEM image of a thin film with $CsPbBr_3$:PEO:PVP=100:50:15.
Figure 3A:
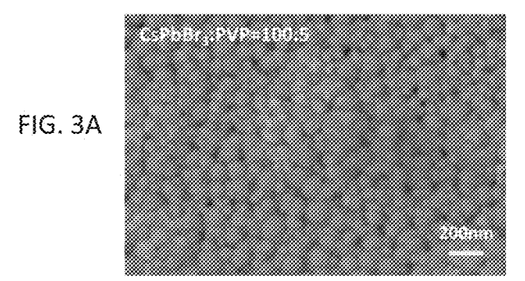
FIG. 3A is a top view SEM image of a thin film with $CsPbBr_3$:PVP=100:5.
Figure 3B:
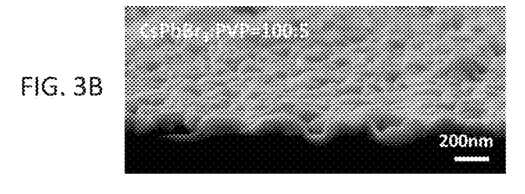
FIG. 3B is a cross-sectional tilted view SEM image of the thin film of FIG. 3A.
Figure 3C:
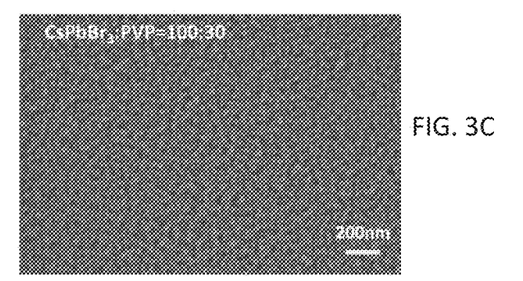
FIG. 3C is a top view SEM image of a thin film with $CsPbBr_3$:PVP=100:30.
Figure 3D:
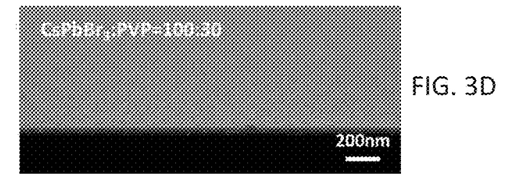
FIG. 3D is a cross-sectional tilted view SEM image of the thin film of FIG. 3C.

In contrast, it was found the CsPbBr$_3$ can be well dispersed by PVP. A composite film with CsPbBr$_3$:PVP=100:5 had a nearly continuous morphology except for some scattered voids of about 20 nm diameter (FIGS. 3A and 3B). The film became fully continuous and pinhole free at CsPbBr$_3$:PVP=100:30 (FIGS. 3C and 3D). Inspired by such an observation, PVP was then added to the CsPbBr$_3$/PEO composite. As shown in FIGS. 1C and 1D from a film with CsPbBr$_3$:PEO:PVP=100:50:5, all the pinholes previously seen in the CsPbBr$_3$/PEO composite had been removed and a dense composite film was formed. At higher PVP ratios (CsPbBr$_3$:PEO:PVP=100:50:15 and 100:50:30) the films remained continuous, however, the density of the CsPbBr$_3$ crystals became reduced (FIGS. 1E and 1F).

The crystallinity of the composite films were characterized by X-ray diffraction (XRD).

Figure 4A:
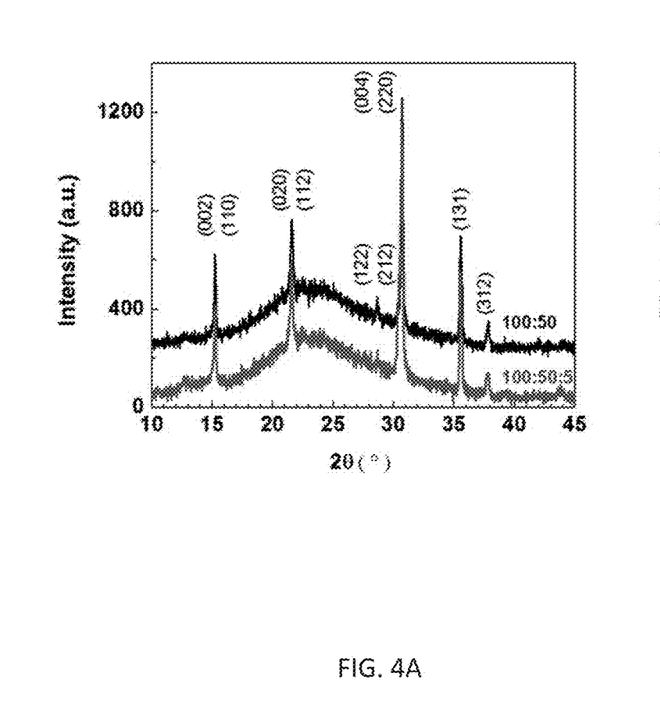
FIG. 4A illustrates XRD patterns of $CsPbBr_3$:PEO (100:50) and $CsPbBr_3$:PEO:PVP (100:50:5) composite thin films.
Figure 4B:
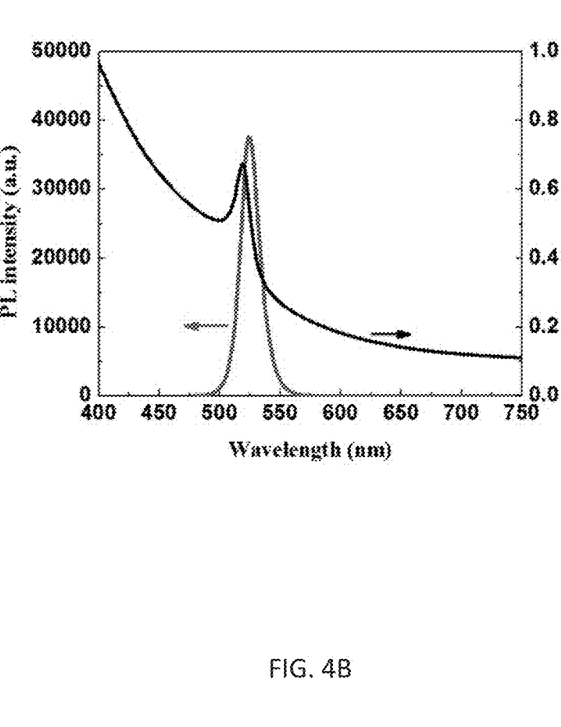
FIG. 4B is a graph of photoluminescence and absorbance spectra of $CsPbBr_3$:PEO:PVP (100:50:5) composite thin film.

The XRD patterns shown in FIG. 4A indicated both the binary and the ternary composite films consisted of polycrystalline CsPbBr$_3$ belonging to an orthorhombic phase. The lattice parameters of the CsPbBr$_3$ were calculated to be a=0.821 nm, b=0.826 nm, and c=1.176 nm, which are in agreement with literature values. Absorbance and photoluminescence (PL) spectra were also collected to evaluate the optical properties of the composite thin films. All films with various PVP ratios behaved nearly the same, and the measurement results of a CsPbBr$_3$:PEO:PVP=100:50:5 film are presented in FIG. 4B. A sharp transition is observed at around ~525 nm in the absorbance spectrum that agrees well with the peak position in the PL spectrum, both corresponding to a bandgap of 2.36 eV in CsPbBr$_3$.

Figure 5A:
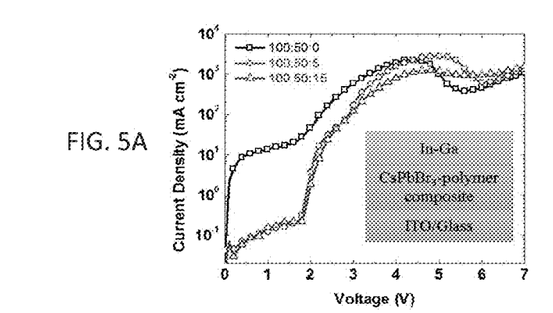
FIG. 5A is a graph of current density versus voltage characteristics of single-layer Cs-Pero LEDs with different PVP compositions in the emissive layers. The inset schematically illustrates the LED device structure as "ITO anode/CsPbBr3-polymer composite/In—Ga cathode".
Figure 5B:
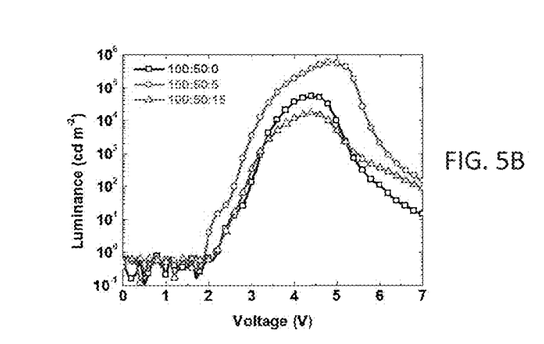
FIG. 5B is a graph of luminance versus voltage characteristics of single-layer Cs-Pero LEDs with different PVP compositions in the emissive layers.

LEDs were constructed using an ITO anode/CsPbBr$_3$-polymer composite/In—Ga cathode as illustrated in FIG. 5A inset. The active area of the devices was about 2 mm diameter as defined by the area of the In—Ga electrode. Current density-voltage (J-V) and luminance-voltage (L-V) characteristics were collected for devices with CsPbBr$_3$:PEO=100:50, and CsPbBr$_3$:PEO:PVP=100:50:5 and 100:50:15 in the emissive layers respectively (FIGS. 5A and 5B). Noticeably, the device without PVP (CsPbBr$_3$:PEO=100:50)

showed a current density about two orders of magnitude higher before 1.9 V when compared to the 100:50:5 and 100:50:15 devices. This may be attributed to electrical leakage due to the discontinuous nature of the binary composite film as shown in FIGS. 1A and 1B. The current densities started to rapidly increase after 1.9 V for all the devices, reaching peak values of 2,226 mA cm² at 4.3 V for the 100:50 composite, 2,787 mA cm² at 4.9 V for the 100:50:5 composite, and 1,226 mA cm² at 4.7 V for the 100:50:15 composite. Immediately after the peak values, all J-V curves entered a negative differential resistance (NDR) region, which extended for an increment of 0.7-1 V external bias. The current density rose up again after the NDR transition, however with a more gradual slope than the onset at 1.9 V.

Figure 5C:
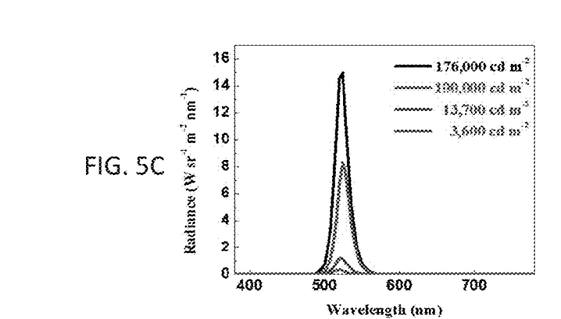
FIG. 5C is a graph of electroluminescence spectra collected at various luminance intensities from a device with $CsPbBr_3$:PEO:PVP=100:50:5 in the emissive layer.
Figure 5D:
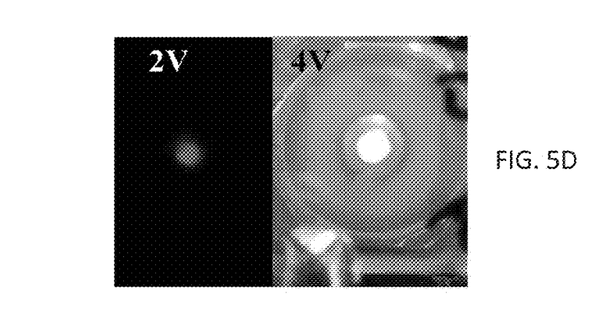
FIG. 5D shows photographs of lit devices according to the present disclosure operating at 2 V bias in dark (left) and at 4 V bias at an indoor lighting environment (right).
Figure 5E:
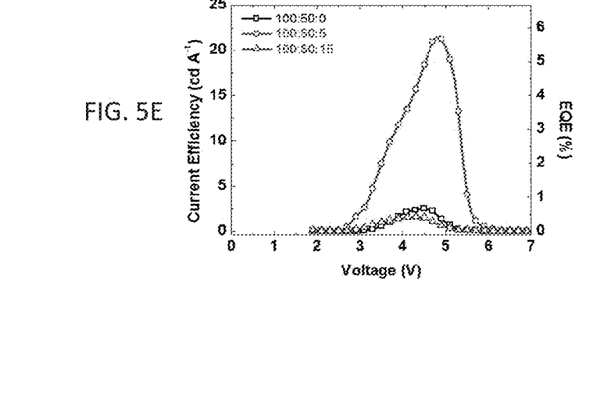
FIG. 5E is a graph of current efficiency/EQE versus voltage characteristics of single-layer Cs-Pero LEDs according to the present disclosure.

As illustrated by the L-V characteristics in FIG. 5B, the 100:50:5 device turned-on at 1.9 V and the luminance increased rapidly with voltage, reaching 100,000 cd m² at 3.7 V and a maximum of 593,178 cd m⁻² at 4.9 V. The other devices both had a turn-on voltage at 2.2V, increasing to a maximum of 54,930 cd m² at 4.5 V for the 100:50 device and 17,543 cd m² at 4.4 V for the 100:50:15 device. All devices emitted green light, and FIG. 5C shows the EL spectra of the 100:50:5 device at various luminance intensities. All spectra had peak positions located at ~522 nm with a FWHM of 21 nm, correlating quite well to the PL spectrum in FIG. 4B. FIG. 5D showed two optical images of a lit LED device with 100:50:5 composite emissive film at 2 V (left) and 4 V (right) applied bias. Real-time videos were also recorded for devices lit at 4 V and 2 V. FIG. 5E shows the efficiency versus voltage characteristics of LEDs with 100:50, 100:50:5 and 100:50:15 composite emissive layers. The current efficiency achieved a maximum of 21.5 cd A⁻¹ at 4.8 V, corresponding to an EQE of 5.7% for the 100:50:5 device; 2.5 cd A⁻¹ at 4.5 V corresponding to an EQE of 0.7% for the 100:50 device; and 1.6 cd A⁻¹ at 4.3 V corresponding to an EQE of 0.4% for the 100:50:15 device.

To evaluate the reproducibility of the best performance, eight devices were fabricated in a single batch with the 100:50:5 composite emissive layer. The device performances are summarized in Table 1. The turn-on voltage varied from 1.8 to 2.1 V, maximum current efficiency from 16.3 to 25.6 cd A⁻¹, EQE from 4.3% to 6.8%, maximum power efficiency from 9.6 to 14.9 lm W⁻¹, and maximum brightness from 416,744 to 804,719 cd m². All devices exhibit very high luminance intensities and high power efficiencies.

Figure 5F:
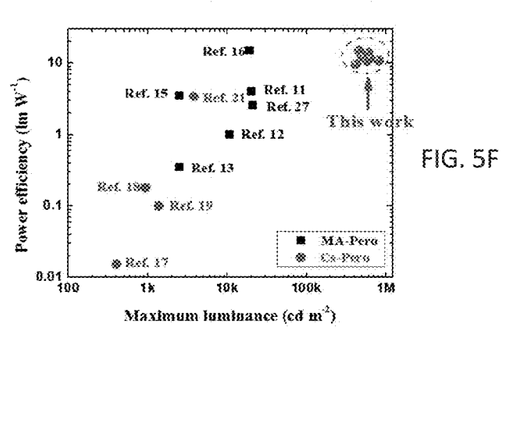
FIG. 5F is a comparison of maximum luminance and power efficiency of Cs-Pero LEDs according to the present disclosure with reported Cs-Pero and MA-Pero green LEDs.

It is worth noting that the combination of high luminous efficiency and high luminance of Pero-LEDs according to various embodiments has greatly outperformed all reported devices using MA-Pero or Cs-Pero as the emissive layer (FIG. 5F).

TABLE 1

Summary of Performance for Eight Pero-LEDs in a Single Batch with 100:50:5 Composite Emissive Layer

| Device No. | Turn-on Voltage (V) | Maximum Current Efficiency (cd A⁻¹) | Voltage at Maximum Current Efficiency (V) | Luminance at Maximum Current Efficiency (cd m⁻²) | Maximum EQE (%) | Maximum Power Efficiency (lm W⁻¹) |
|---|---|---|---|---|---|---|
| 1 | 2.0 | 16.3 | 5.3 | 416,744 | 4.3 | 9.6 |
| 7 | 1.8 | 25.6 | 5.4 | 453,306 | 6.8 | 14.9 |
| 3 | 2.0 | 22.4 | 5.7 | 498,953 | 6.0 | 12.4 |
| 4 | 2.1 | 20.4 | 5.3 | 530,423 | 5.4 | 12.1 |
| 5 | 2.0 | 20.3 | 6.0 | 586,395 | 5.4 | 10.6 |
| 6 | 1.9 | 21.5 | 4.8 | 591,197 | 5.7 | 14.1 |
| 7 | 2.0 | 18.8 | 5.1 | 635,729 | 5.0 | 11.6 |
| 8 | 2.0 | 18.8 | 5.5 | 804,719 | 5.0 | 10.7 |

Figure 6A:
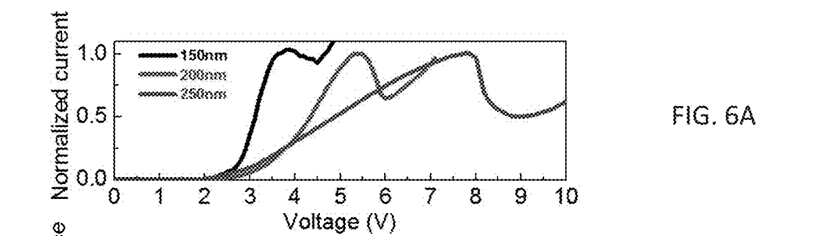
FIG. 6A is a graph of normalized current density-voltage characteristics of devices ($CsPbBr_3$:PEO:PVP=100:50:5) with emissive layer thickness of 150 nm, 200 nm, and 250 nm.
Figure 6B:
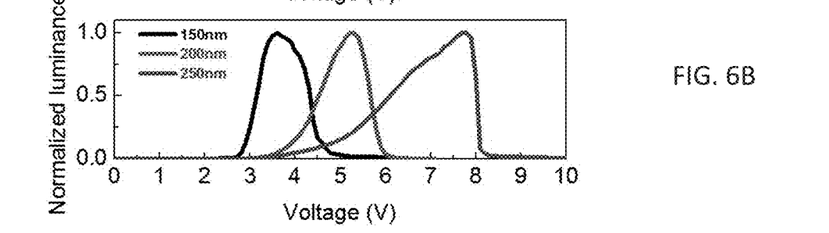
FIG. 6B is a graph of normalized luminance-voltage characteristics of devices ($CsPbBr_3$:PEO:PVP=100:50:5) with emissive layer thickness of 150 nm, 200 nm, and 250 nm.
Figure 6C:
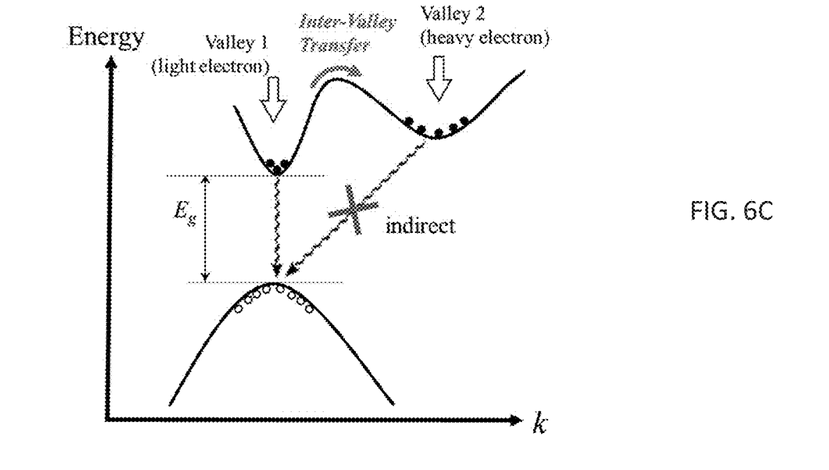
FIG. 6C is an illustration of intervalley transfer in $CsPbBr_3$ leading to an NDR transition and declined emission characteristics in Cs-Pero LEDs as more electrons entering a higher energy satellite valley after a critical electric field.

To further understand the origin of the NDR phenomenon in the J-V curves in FIG. 5A, devices (100:50:5) were fabricated with an emissive layer thickness of 150 nm, 200 nm, and 250 nm, respectively. As shown in FIG. 6A, all devices exhibited a NDR transition with the threshold voltage occurring at 3.8 V for the 150 nm device, 5.4 V for the 200 nm device, and 7.9 V for the 250 nm device, corresponding to an electrical field of 25.3 MV m⁻¹, 27.0 MV m⁻¹, and 31.6 MV m⁻¹, respectively. Given the considerable thickness variation, the threshold electrical field appeared within a narrow range. The luminance of all the three devices also steeply declined after the threshold voltage (FIG. 6B). Based on both observations, it is speculated that intervalley carrier transfer may have occurred in the $CsPbBr_3$/polymer composite film as schematically explained in FIG. 6C: electrons start to transfer into a neighboring high-energy satellite valley above a threshold electrical field. Such a transfer may lead to a lower carrier mobility that contributes to the declining current within the NDR region and the more gradual slope of current increase after the NDR region. The intervalley transfer may greatly decreases radiative recombination probability of the injected charge carriers, causing fast luminance decay after the threshold voltage.

Remarkably, the turn-on voltage in devices according to various embodiments was 0.26-0.56 V lower than the $E_g/e$ of the perovskite emitter. Such an efficient turn-on is usually found in commercial inorganic LEDs that emit infrared, red or green light based on small bandgap III-V semiconductors such as GaAs and AlGaInP. In those devices, both p and n type doping can be readily achieved and the employment of a p-i-n device structure effectively removes the charge injection barriers between the electrodes and the emissive semiconductor layer. Given the extremely simplified device structure in our work, it is hypothesized that a p-i-n junction may have formed in-situ within the $CsPbBr_3$-PEO-PVP composite film when an external bias was applied.

Figure 7A:
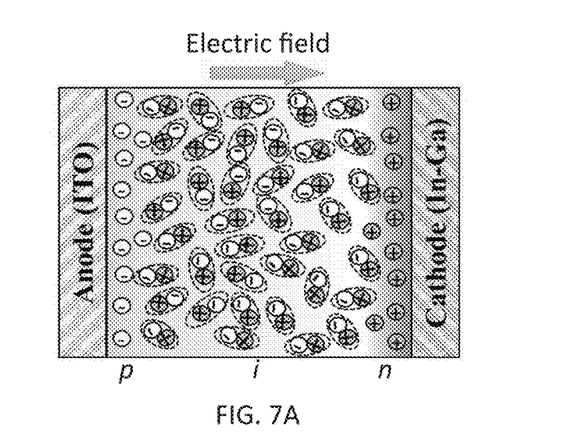
FIG. 7A is a schematic illustration of junction formation in the $CsPbBr_3$-polymer composite film under an external electrical field. Cations and/or anions migrate toward and accumulate at the perovskite/cathode and perovskite/anode interfaces, resulting in formation of a p-i-n junction.

It has been reported that the methyl ammonium cations in $MAPbI_3$ can migrate towards the cathode at a relatively low electrical field (<1 V m⁻¹). Therefore, the ionic species in the $CsPbBr_3$-PEO-PVP composites may respond in a similar way as the methyl ammonium cations to an external electrical field, and develop net charges at the electrode/perovskite interfaces (FIG. 7A). The accumulation of ions can create a p-type equivalent region along the anode/perovskite interface, and an n-type equivalent region along the cathode/perovskite interface, thus form an analogy of a p-i-n junction in the perovskite layer.

Figure 7B:
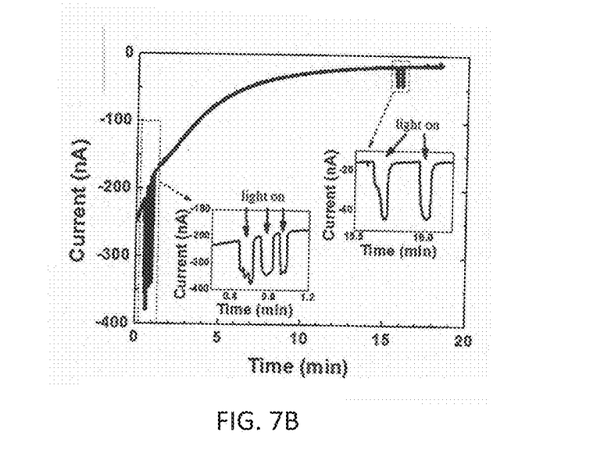
FIG. 7B is a graph of discharging current evolution with time by short-circuiting a pre-biased LED device. The device had an emissive layer thickness of 2 µm, and was exposed to 20 V for 10 seconds prior the discharging test. The insets are enlarged portions showing the photo response of the device using a commercial white LED light source (~10 mW/cm²).
Figure 7C:
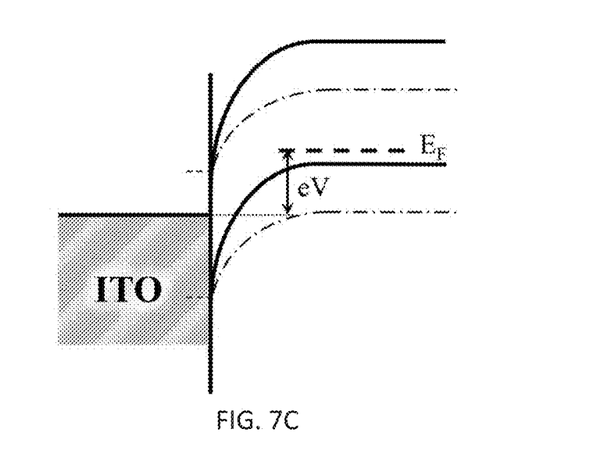
FIG. 7C is a band diagram schematic at the anode/$CsPbBr_3$ interface for the single-layer LED device with (solid lines) and without (dot-dashed lines) junction formation, manifesting the narrowing of barrier width after ion migration and accumulation, which is equivalent to lowering the effective barrier height. e is elementary charge, V represents the voltage drop across the anode/$CsPbBr_3$ interface, and $E_F$ is the quasi Fermi level of $CsPbBr_3$ in the composite film.
Figure 8:
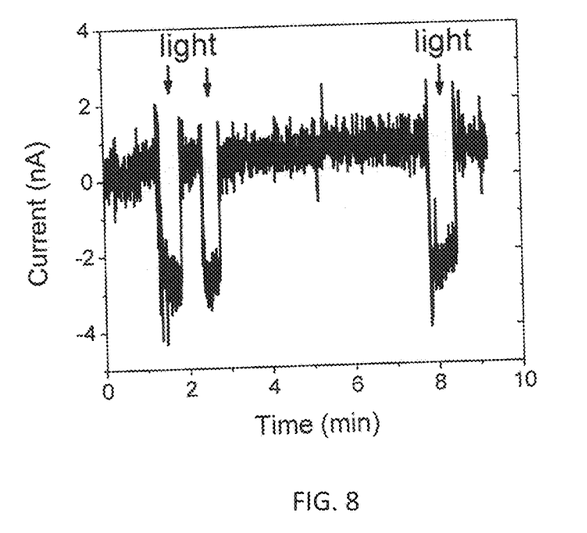
FIG. 8 is a graph of photocurrent response of an un-biased Pero-LED device.
Figure 9:
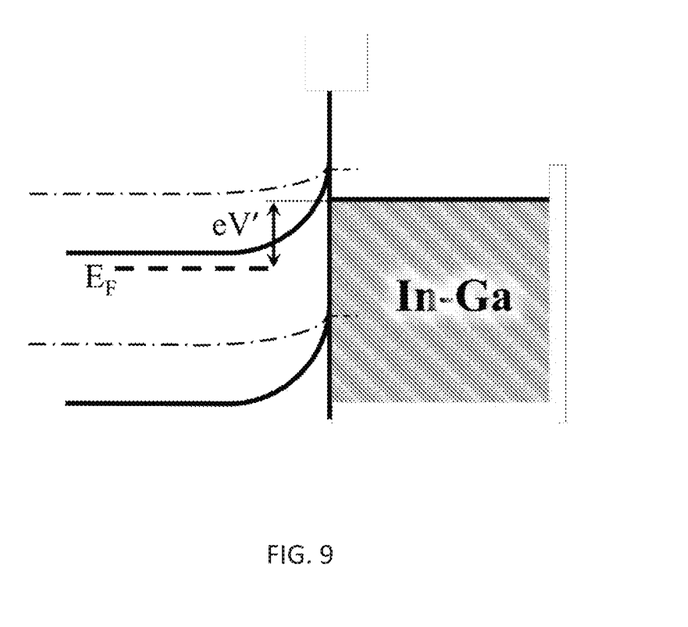
FIG. 9 is a band diagram schematic at the cathode/composite interface for ITO/CsPbBr$_3$-polymer composite/In—Ga device with (solid lines) and without (dot-dashed lines) junction formation, manifesting the narrowing of barrier width after ion migration and accumulation. e is elementary charge, V' represents the voltage drop across the cathode/CsPbBr$_3$ interface, and $E_F$ is the quasi Fermi level of CsPbBr$_3$ in the composite film.

To verify the ion migration/accumulation hypothesis, time dependent discharging current ($I_{dis}$) was measured as shown in FIG. 7B by short-circuiting a pre-biased LED device. The $I_{dis}$ started at 240 nA, and decayed exponentially with time. Such a behavior is in agreement with the neutralization process of the accumulated ions through ionic diffusion during the discharging test. Junction formation in the CsPbBr$_3$-PEO-PVP composite film is further supported by photo current response (FIG. 7B insets) of a pre-biased device. A photo current of 150 nA was measured under a light source irradiation within the first minute of discharging, showing the separation of photo-induced carriers was quite efficient due to the p-i-n junction formation. In contrast, the photo current was ~3 nA for a freshly prepared un-biased device (FIG. 8), which is typical for a device without a p-i-n junction. After 15-16 minutes of discharging, the photo current reduced to about 20 nA, suggesting the degradation of the junction during the discharging process. As a result of large density ion accumulation and heavy doping, a sharp tunneling barrier evolves for electron and hole injection at the perovskite/electrode interfaces and greatly reduces contact resistance compared to a conceptual device that doesn't form such a junction (FIGS. 7C and 9). The in-situ junction formation has resulted in very efficient electron and hole injection into the CsPbBr$_3$, which contributes to an ultra-high luminance intensity in Pero-LEDs, according to various embodiments.

Figure 10A:
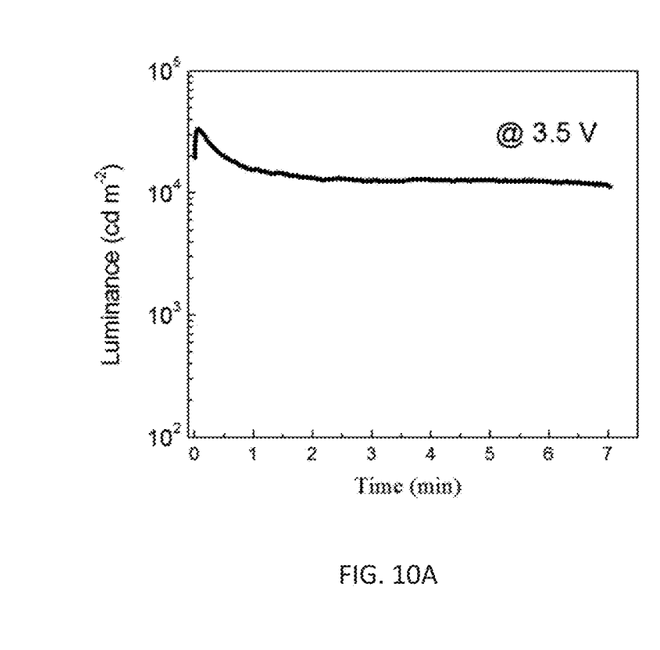
FIG. 10A is a graph of a stress test of Pero-LEDs with the 100:50:5 emissive layer at 3.5 V bias in a nitrogen filled dry box.
Figure 10B:
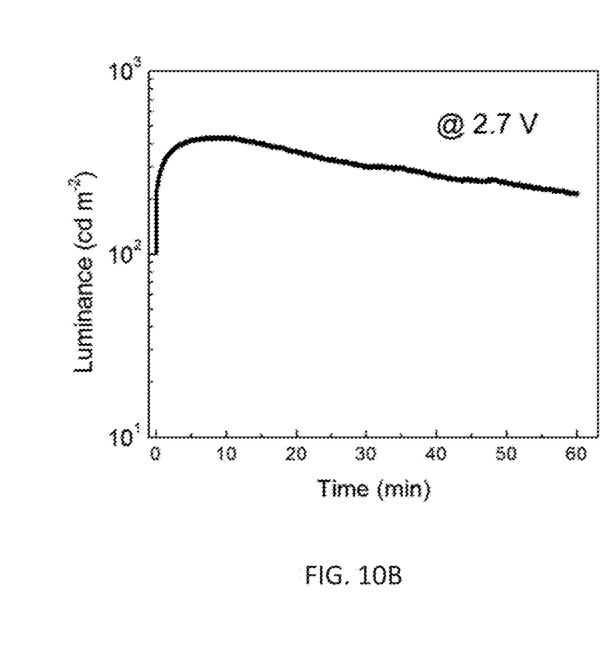
FIG. 10B is a graph of a stress test of Pero-LEDs with the 100:50:5 emissive layer at 2.7 V bias in a nitrogen filled dry box.
Figure 11:
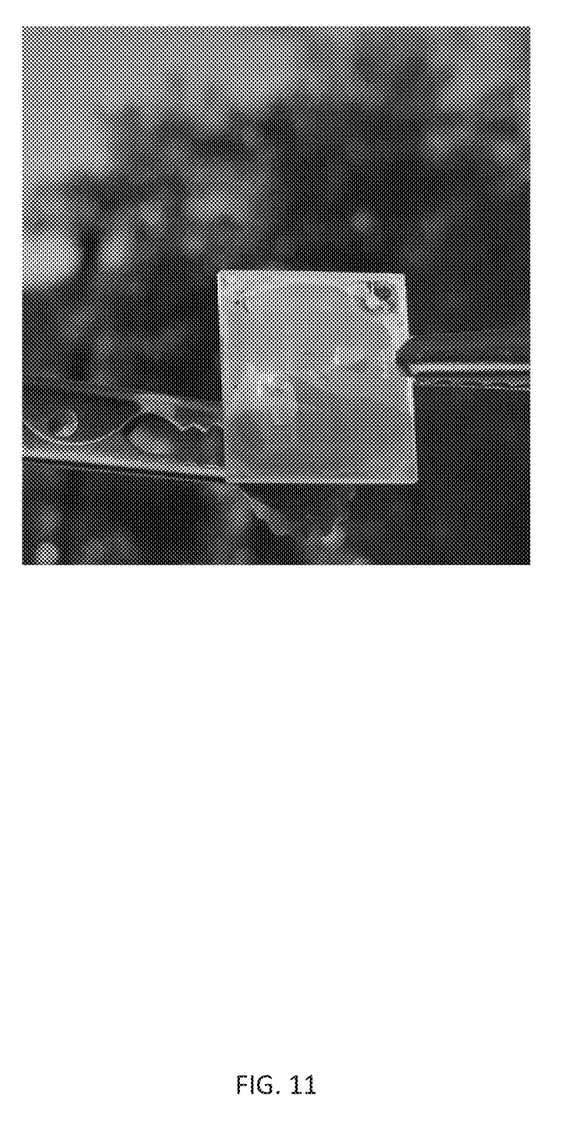
FIG. 11 is a photograph of one 100:50:5 device at 4 V under sunlight. The devices were illuminated in ambient air (30° C. and 60% relative humidity).

The stability of devices according to various embodiments under continuous operation at a constant voltage was also evaluated at room temperature inside a nitrogen filled dry box with oxygen and moisture concentrations both about 1 ppm. As shown in FIG. 10A, when the applied bias was 3.5 V the EL intensity obtained a peak value of 33,680 cd m$^{-2}$ in 3 s; then decayed to about 13,000 cd m$^{-2}$ in one minute and remained relatively stable for more than six minutes. When 2.7 V was used, the device required about five minutes to reach its peak luminance (~400 cd m$^2$), as shown in FIG. 10B, decaying to 500% of its peak value after about 50 minutes. The finite time for obtaining the peak luminance is consistent with the above p-i-n junction hypothesis since the migration of ionic species is required for the junction formation. In addition, the devices were illuminated in ambient air (30° C. and 60% relative humidity) and showed a high brightness that was clearly seen under sunlight (FIG. 11). The stability of Pero-LEDs have seldom been reported in literature, but devices according to various embodiments performed the best among those reported.

In summary, in an exemplary embodiment of the present invention, pinhole-free CsPbBr$_3$-PEO-PVP ternary composite thin films were developed using a one-step solution process. Single-layer LEDs were fabricated with a device structure of ITO/CsPbBr$_3$-PEO-PVP composite thin film/In—Ga. The LEDs of the present invention exhibited a sub-bandgap turn-on voltage of 1.9 V and an ultra-high luminance of 593,178 cd m$^{-2}$ with a maximum power efficiency of 14.1 lm W$^{-1}$. The low turn-on voltage and high luminance are both attributed to an in-situ junction formation in the perovskite composite thin film under an external bias.

EXPERIMENTAL

Materials: Lead(II) bromide (99.999%), cesium bromide (99.999%), N,N-dimethylformamide (DMF, anhydrous, 99.8%), dimethyl sulfoxide (DMSO, anhydrous, 99.9%), poly(ethylene oxide) (average M$_w$~5,000,000), poly(vinylpyrrolidinone) (average M$_w$~1,300,000), and indium-gallium eutectic (99.99%) were purchased from Sigma-Aldrich. All materials were used as received.

Film preparation and characterizations: The Cs-Pero precursor solution was prepared by dissolving PbBr$_2$ and CsBr in a 1:1.5 molar ratio in anhydrous DMSO to give a concentration of 120 mg mL$^{-1}$. PEO and PVP were dissolved in DMF with a concentration of 10 mg mL$^{-1}$ and 50 mg mL$^{-1}$, respectively. The Pero precursor, PEO and PVP solutions were then mixed with desired ratio. All the solutions were stirred at 120° C. for 30 mins before use. The ITO/glass substrates (20 ohms sq$^{-1}$) were cleaned subsequently with detergent water, deionized water, acetone and isopropanol for 5 mins with sonication, and then blow dried with nitrogen and treated with oxygen plasma at 100 W power for 2 mins. The mixture solution was spin-coated onto the ITO/glass at 1500 rpm for 1 min. The films were then annealed at 200° C. for 30 seconds. Solution and film preparation, and following device testing were carried out inside a nitrogen filled glove box with oxygen and moisture level both at ~1 ppm. Commercial tools of field emission SEM (Zeiss 1540 EsB) and UV-Vis-NIR spectrometer (Varian Cary 5000) were used to characterize the composite thin films. PL spectra were collected at room temperature on a Horiba Jobin Yvon FluoroMax-4 Fluorometer. The excitation wavelength was fixed at 460 nm. The emission spectra from 480 to 780 nm were collected with an integration time of 0.1 s.

LED measurement: Current density-voltage and luminance-voltage characteristics were measured with a Keithley 2410 source meter and a silicon photodiode. The silicon photodiode was further calibrated by a Photo Research PR-655 spectroradiometer. The EL spectra were collected by the PR-655 with neutral density filters providing attenuation down to 3% within visible wavelength region.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. An emissive perovskite ternary composite thin film comprising:
   a perovskite material;
   an ionic-conducting polymer; and
   an ionic-insulating polymer;
   wherein the ionic-conducting polymer and the ionic-insulating polymer are dispersed in the perovskite material, and
   wherein a weight ratio of the ionic-conducting polymer to the ionic-insulating polymer in the emissive perovskite ternary composite thin film is 50:15 to 50:30.

2. The emissive perovskite ternary composite thin film of claim 1, wherein the perovskite material is an organometal halide perovskite material.

3. The emissive perovskite ternary composite thin film of claim 1, wherein the perovskite material is a methylammonium lead halide (CH$_3$NH$_3$PbX$_3$), wherein X is a halide.

4. The emissive perovskite ternary composite thin film of claim 1, wherein the perovskite material is selected from the group consisting of cesium lead halide (CsPbX$_3$) and cesium lead tribromide (CsPbBr$_3$), wherein X is a halide.

5. The emissive perovskite ternary composite thin film of claim 1, wherein the ionic-conducting polymer is PEO (poly(ethylene oxide)).

6. The emissive perovskite ternary composite thin film of claim 1, wherein the ionic-insulating polymer is PVP (poly(vinylpyrolidone)).

7. The emissive perovskite ternary composite thin film of claim 1, wherein the perovskite material is cesium lead tribromide ($CsPbBr_3$), the ionic-conducting polymer is PEO (poly(ethylene oxide)) and the ionic-insulating polymer is PVP (poly(vinylpyrolidone)).

8. The emissive perovskite ternary composite thin film of claim 1, wherein the ionic-conducting polymer is PEO and the ionic-insulting is PVP and wherein the PEO and PVP are dissolved in dimethylformamide (DMF).

* * * * *